United States Patent
Xie et al.

(10) Patent No.: US 12,310,061 B2
(45) Date of Patent: May 20, 2025

(54) NANOSHEET TRANSISTOR DEVICES WITH DIFFERENT ACTIVE CHANNEL WIDTHS

(71) Applicant: International Business Machines Corporation, Armonk, NY (US)

(72) Inventors: Ruilong Xie, Niskayuna, NY (US); Julien Frougier, Albany, NY (US); Kangguo Cheng, Schenectady, NY (US); Chanro Park, Clifton Park, NY (US); Cheng Chi, Jersey City, NJ (US); Jinning Liu, Andover, MA (US)

(73) Assignee: International Business Machines Corporation, Armonk, NY (US)

( * ) Notice: Subject to any disclaimer, the term of this patent is extended or adjusted under 35 U.S.C. 154(b) by 733 days.

(21) Appl. No.: 17/485,333

(22) Filed: Sep. 25, 2021

(65) Prior Publication Data
US 2023/0123883 A1      Apr. 20, 2023

(51) Int. Cl.
| | | |
|---|---|---|
| H10D 30/67 | (2025.01) | |
| H10D 62/10 | (2025.01) | |
| H10D 84/01 | (2025.01) | |
| H10D 84/03 | (2025.01) | |
| H10D 84/83 | (2025.01) | |

(52) U.S. Cl.
CPC ..... *H10D 30/6735* (2025.01); *H10D 30/6757* (2025.01); *H10D 62/118* (2025.01); *H10D 84/0128* (2025.01); *H10D 84/038* (2025.01); *H10D 84/83* (2025.01)

(58) Field of Classification Search
CPC ........... H01L 29/42392; H01L 29/0665; H01L 27/088; H01L 21/823412; H01L 21/823456; H01L 21/823481; H01L 29/78696; H01L 29/775; H01L 29/66439
See application file for complete search history.

(56) References Cited

U.S. PATENT DOCUMENTS

| | | | |
|---|---|---|---|
| 8,846,491 B1 * | 9/2014 | Pham | H01L 21/02104 |
| | | | 257/E21.409 |
| 10,002,943 B2 * | 6/2018 | Hong | H01L 29/1608 |
| 10,103,238 B1 | 10/2018 | Zang et al. | |
| 10,388,519 B2 | 8/2019 | Smith et al. | |
| 10,510,620 B1 | 12/2019 | Chanemougame et al. | |
| 10,665,669 B1 * | 5/2020 | Xie | H01L 27/0886 |
| 10,840,329 B1 | 11/2020 | Xie et al. | |
| 10,978,299 B2 | 4/2021 | Noh et al. | |
| 10,985,161 B2 | 4/2021 | Xu et al. | |

(Continued)

FOREIGN PATENT DOCUMENTS

| | | |
|---|---|---|
| CN | 111063682 A | 4/2020 |
| KR | 20200032224 A | 3/2020 |

*Primary Examiner* — Bryan R Junge
*Assistant Examiner* — Mario Andres Autore, Jr.
(74) *Attorney, Agent, or Firm* — Samuel Waldbaum; Ryan, Mason & Lewis, LLP

(57) ABSTRACT

A semiconductor structure comprises a substrate defining a first axis and a second axis orthogonal to the first axis, a first nanosheet region disposed on the substrate and defining a first channel width along the second axis, a first gate disposed around the first nanosheet region, a second nanosheet region disposed on the substrate and defining a second channel width along the second axis less than the first channel width of the first nanosheet region and a second gate disposed around the second nanosheet region.

20 Claims, 14 Drawing Sheets

(56) References Cited

U.S. PATENT DOCUMENTS

| | | | |
|---|---|---|---|
| 2019/0148373 A1* | 5/2019 | Shi | H01L 21/31144 |
| | | | 257/401 |
| 2019/0172828 A1 | 6/2019 | Smith et al. | |
| 2019/0295898 A1 | 9/2019 | Xie et al. | |
| 2020/0075574 A1 | 3/2020 | Smith et al. | |
| 2020/0343387 A1* | 10/2020 | Liaw | H01L 27/0922 |
| 2020/0373168 A1* | 11/2020 | Lee | H01L 21/02532 |
| 2020/0395470 A1* | 12/2020 | Kim | H01L 29/785 |
| 2021/0202478 A1* | 7/2021 | Guha | H01L 29/78696 |
| 2021/0210489 A1* | 7/2021 | Zhang | H01L 27/0924 |
| 2021/0249311 A1* | 8/2021 | Paak | H01L 29/66742 |
| 2022/0328625 A1* | 10/2022 | Pan | H01L 27/0922 |
| 2023/0087690 A1* | 3/2023 | Frougier | H01L 23/5286 |
| | | | 257/213 |

* cited by examiner

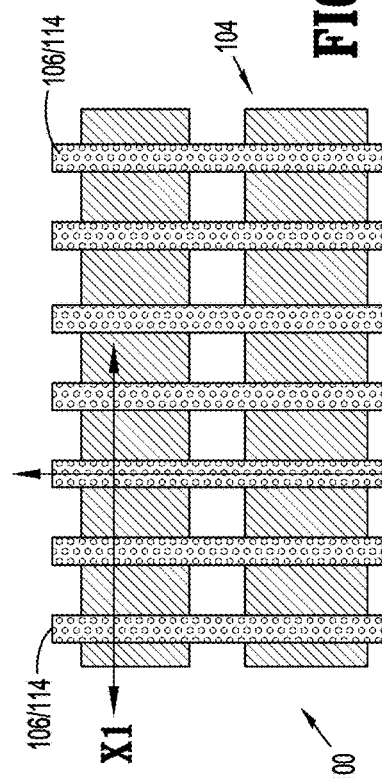
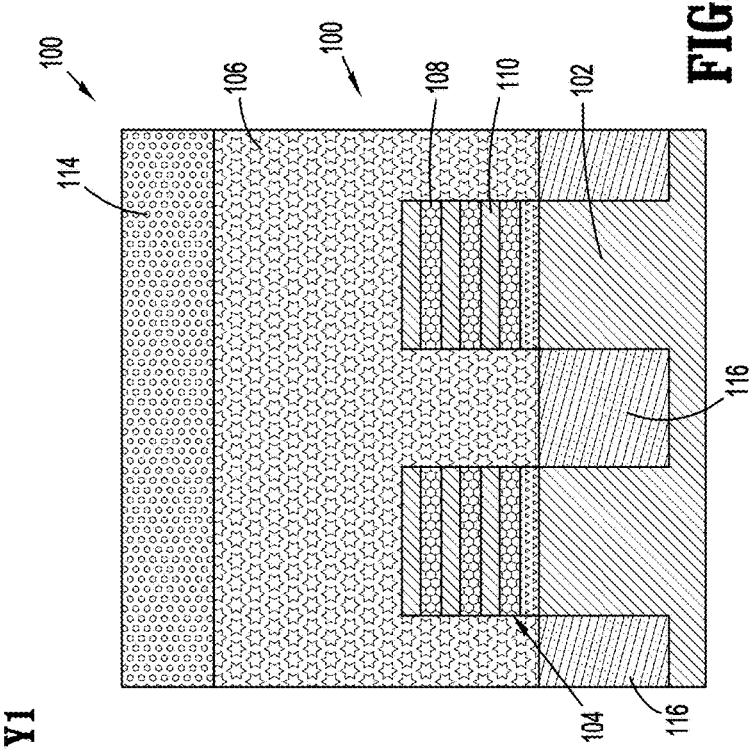
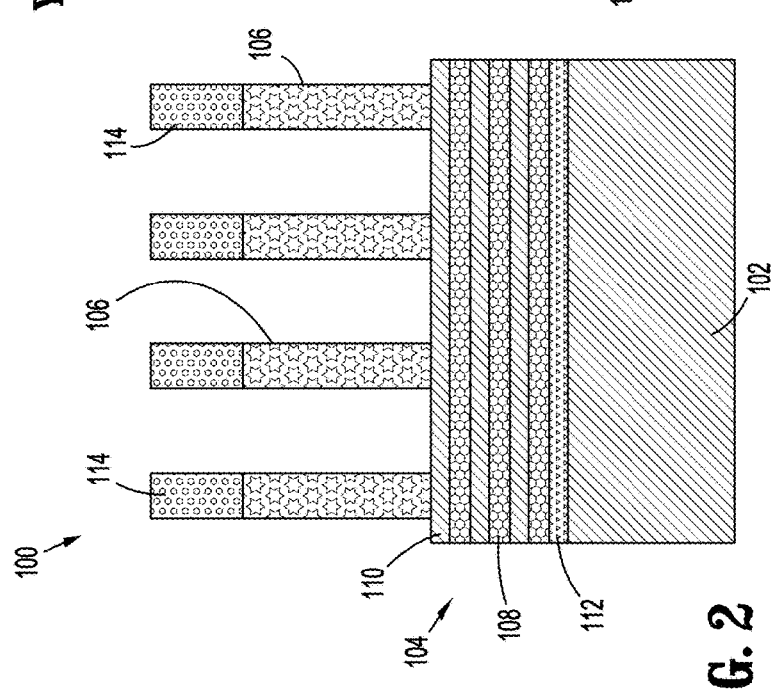

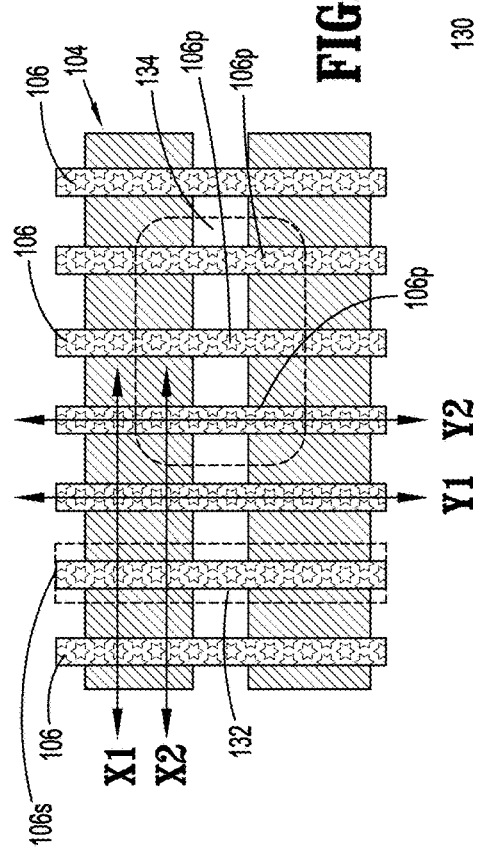
FIG. 8
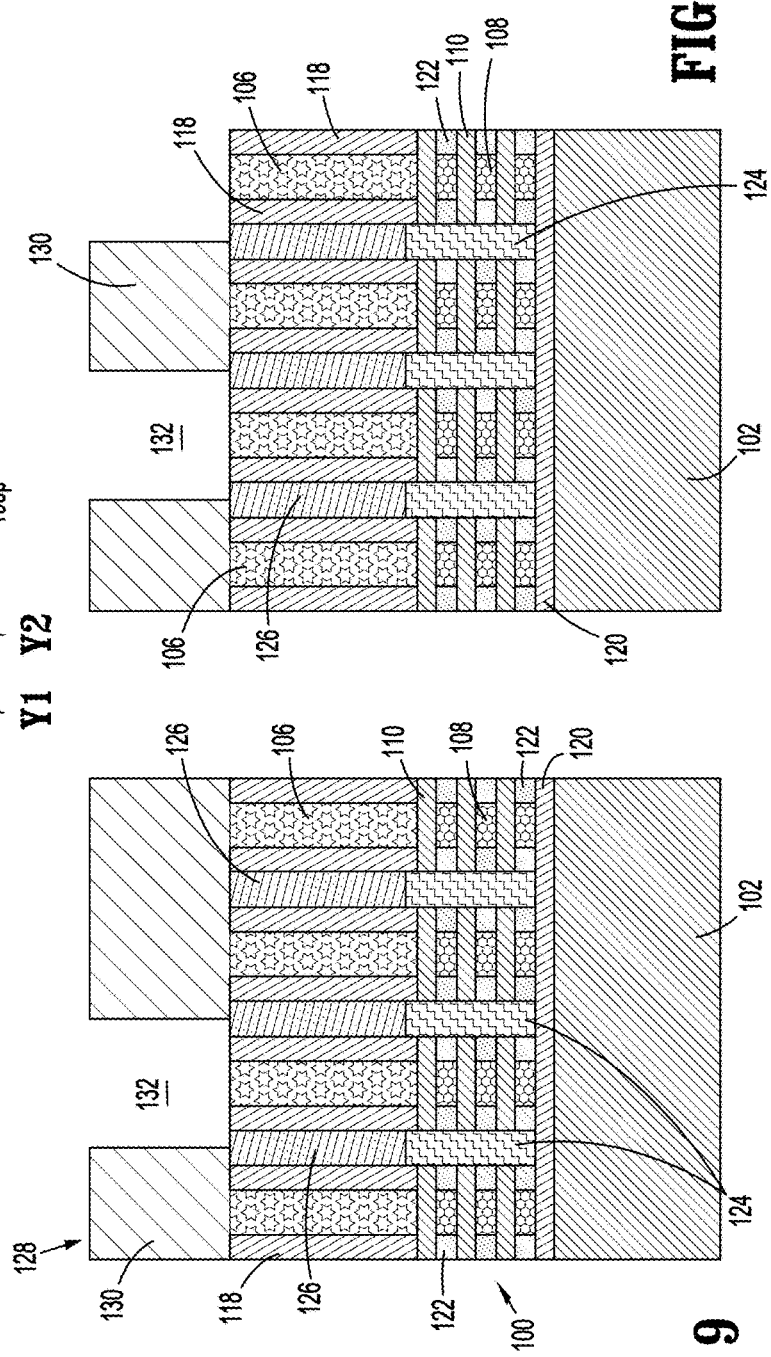
FIG. 9
FIG. 10

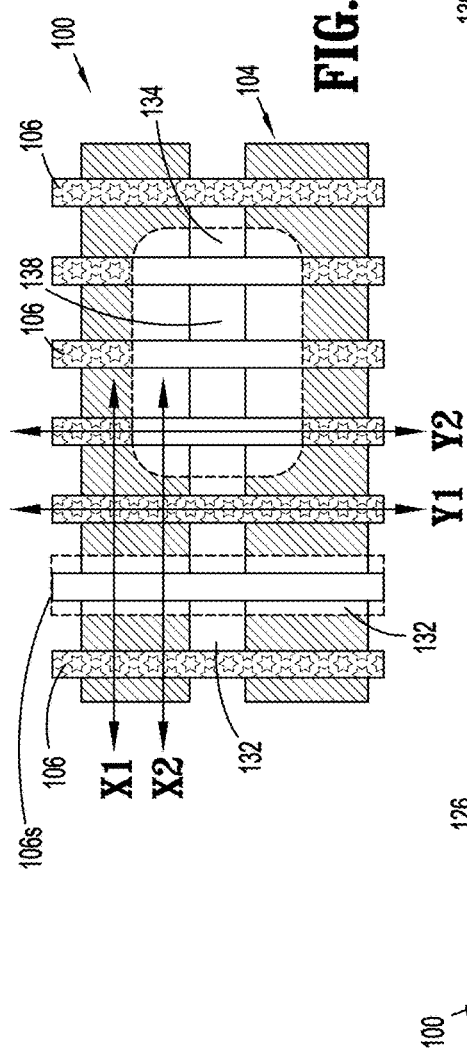
FIG. 13
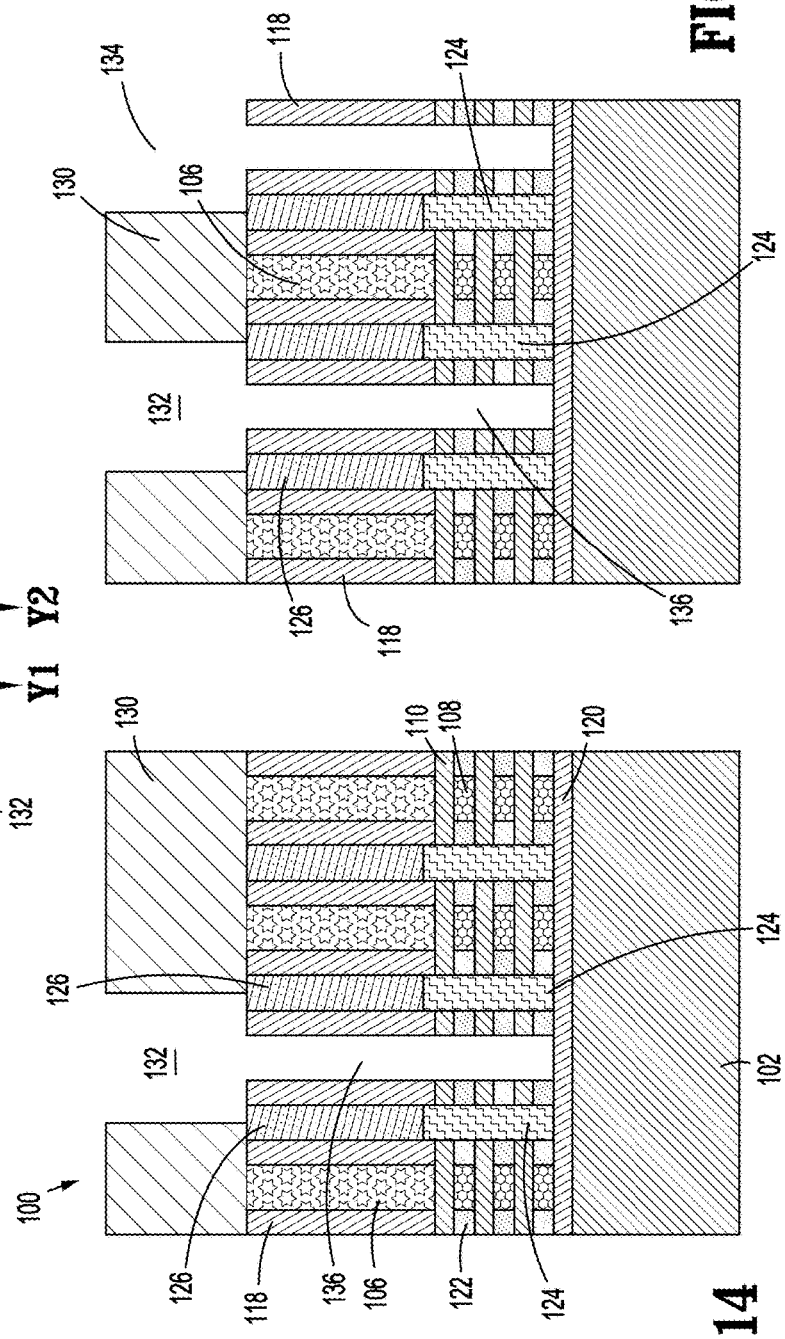
FIG. 14
FIG. 15

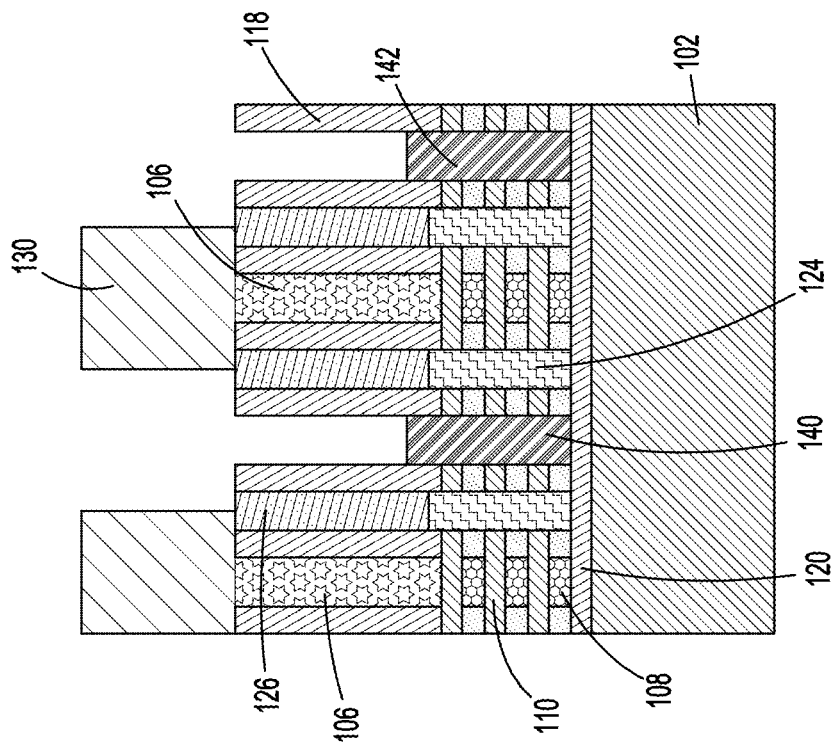
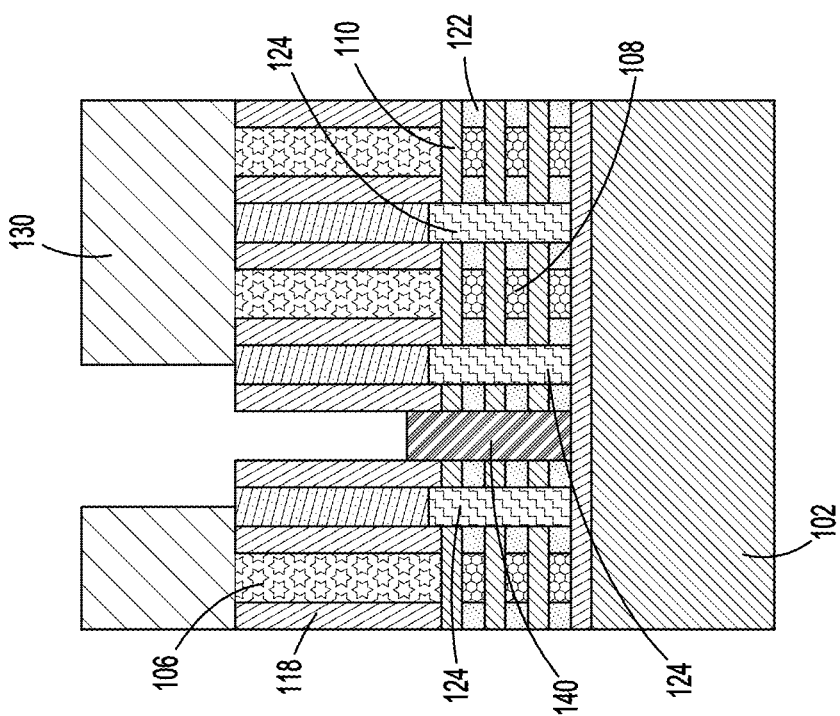

NANOSHEET TRANSISTOR DEVICES WITH DIFFERENT ACTIVE CHANNEL WIDTHS

BACKGROUND

Continued innovations in semiconductor process technologies are enabling higher integration densities and associated device scaling. As the semiconductor industry moves towards the 5 nanometer (nm) production node and beyond, fin field-effect transistor (FinFET) devices must be scaled to smaller dimensions to provide an increased effective channel width per footprint area. Such scaling in some cases is achieved using nanosheet devices. A given nanosheet FinFET device comprises a channel which includes multiple nanosheet layers arranged in a stacked configuration, with each nanosheet layer having a vertical thickness that is substantially less than its width. A common gate structure is formed in areas wrapping around the nanosheet layers in the stacked configuration, thereby increasing the effective channel width of the resulting device, and thus the drive current supported thereby, for a given footprint area. Nanosheet technologies are considered to be a viable option for continued scaling of metal-oxide-semiconductor (MOS) devices, such as complementary MOS (CMOS) devices each comprising an N-type FET (NFET) and a P-type FET (PFET).

However, problems can arise in the production of nanosheet device features, particularly, at production nodes below 5 nm. For example, power consumption of the nanosheet device may be excessive and deleterious to the functioning of the device. In addition, the reduced scaling presents issues with respect to forming gate contacts. In an effort to alleviate some of the aforedescribed issues associated with nanosheet technologies, some manufacturing techniques include a tapering active region feature to reduce the effective channel width for certain long power devices. However, known tapering techniques present issues having a deleterious effect on epitaxial growth of source/drain regions and on etching processes associated with gate patterning.

SUMMARY

Accordingly, illustrative embodiments provide techniques for use in fabrication of nanosheet FET structures. The techniques disclosed herein effectively maximize spacing for deposition of an increased volume of gate dielectric to accommodate input and/or output devices of a nanosheet FET structure.

In accordance with one illustrative embodiment, a semiconductor structure comprises a substrate defining a first axis and a second axis orthogonal to the first axis, a first nanosheet region disposed on the substrate and defining a first channel width along the second-axis, a first gate disposed around the first nanosheet region, a second nanosheet region disposed on the substrate and defining a second channel width along the second axis less than the first channel width of the first nanosheet region and a second gate disposed around the second nanosheet region.

In accordance with another illustrative embodiment, a semiconductor structure comprises a substrate defining a first axis and a second axis orthogonal to the first axis and at least two nanosheet stacks disposed on the substrate and extending along the first axis. The at least two nanosheet stacks comprise a plurality of channel nanosheets. A dielectric isolator is coupled to the semiconductor structure and disposed between the channel nanosheets of the at least two nanosheet stacks. The dielectric isolator extends vertically above the at least two nanosheet stacks. A gate structure extends across the at least two sets of channel nanosheets and has gate portions above the dielectric isolator.

In accordance with another illustrative embodiment, a method comprises forming a first nanosheet region on a substrate defining a first axis and a second axis orthogonal to the first axis, forming a first gate disposed around the first nanosheet region, forming a second nanosheet region disposed on the substrate and forming a second gate disposed around the second nanosheet region. The first nanosheet region defines a first channel width along the second axis. The second nanosheet region defines a second channel width along the second axis. The second channel width of the second nanosheet region is less than the first channel width of the first nanosheet region.

These and other objects, features and advantages of the present disclosure will become apparent from the following detailed description of illustrative embodiments thereof, which is to be read in connection with the accompanying drawings.

BRIEF DESCRIPTION OF THE DRAWINGS

FIG. 1 is a plan view in plan of a semiconductor structure including one or more nanosheet structures and gates to be processed at a first intermediate stage of fabrication according to one or more illustrative embodiments.

FIG. 2 is a cross-sectional view of the semiconductor structure of FIG. 1 along the lines X1-X1 at the first intermediate stage of fabrication, illustrating a semiconductor substrate, a nanosheet stack on the semiconductor substrate and a plurality of dummy gates formed about the nanosheet stack according to one or more illustrative embodiments.

FIG. 3 is a cross-sectional view of the semiconductor structure of FIG. 1 along the lines Y1-Y1 at the first intermediate stage of fabrication, illustrating the semiconductor substrate, a pair of nanosheet stacks disposed on the semiconductor substrate and the dummy gates formed about each nanosheet stack of the pair according to one or more illustrative embodiments.

FIG. 8 is a plan view of the semiconductor structure similar to the view of FIG. 1 at a fourth intermediate stage of fabrication illustrating application of a mask onto the semiconductor structure according to one or more illustrative embodiments.

FIGS. 9 and 10 are cross-sectional views of the semiconductor structure taken along the lines X1-X1 and X2-X2 of FIG. 8, respectively, at the fourth intermediate stage of fabrication illustrating the first and second openings in the mask according to one or more illustrative embodiments.

FIG. 13 is a plan view of the semiconductor structure similar to the view of FIG. 8 at a fifth intermediate stage of fabrication illustrating formation of the recess for the single diffusion break and the tapered recess for the dielectric isolator according to one or more illustrative embodiments.

FIGS. 14 and 15 are cross-sectional views of the semiconductor structure taken along the lines X1-X1 and X2-X2 of FIG. 13, respectively, at the fifth intermediate stage of fabrication according to one or more illustrative embodiments.

FIGS. 18 and 19 are cross-sectional views of the semiconductor structure similar to the views of FIGS. 14 and 15, respectively at a sixth intermediate stage of fabrication illustrating deposition of a dielectric fill material in the recess for the single diffusion break and the tapered isolator according to one or more illustrative embodiments.

DETAILED DESCRIPTION

Figure 5:
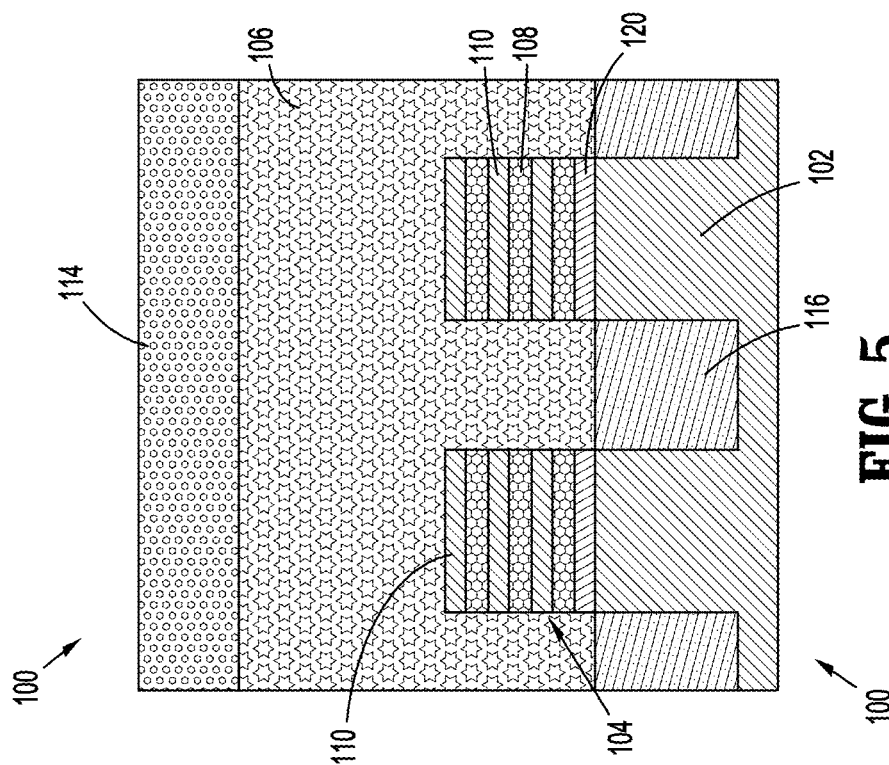
FIGS. 4 and 5 are cross-sectional views of the semiconductor structure similar to the views of FIGS. 2 and 3, respectively, at a second intermediate stage of fabrication, illustrating formation of source/drains, recessing of the nanosheet stacks and spacer formation about the dummy gates according to one or more illustrative embodiments.

It is understood in advance that although this description includes a detailed description of an illustrative nanosheet FinFET architecture having channel layers and sacrificial layers, implementation of the teachings recited herein are not limited to the particular FinFET architecture described herein. Rather, embodiments of the present invention are capable of being implemented in conjunction with any other type of FinFET device, including, for example, any FinFET with active regions, including, but not limited to nanosheet FinFET architectures and transistor structures.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto a semiconductor device. Available technologies include physical vapor deposition (PVD), chemical vapor deposition (CVD), electrochemical deposition (ECD), molecular beam epitaxy (MBE) and, more recently, atomic layer deposition (ALD) among others. Removal/etching is any process that removes material from the semiconductor structure. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to an underlying substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the substrate, for example, a wafer, is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., film deposition, removal/etching, semiconductor doping, patterning/lithography and annealing steps, are purposefully not described in great detail herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a nanosheet FET transistor structure of a device according to illustrative embodiments utilize a variety of individually known physical and chemical processes performed on a semiconductor (e.g., silicon) substrate, some of which are described in the immediately following paragraphs.

In the discussion that follows, the semiconductor device, which will incorporate one or more nanosheet FinFET transistor structures or devices, will be referred to as the "semiconductor structure 100" throughout the various stages of fabrication, as represented in all the accompanying drawings. In addition, the following discussion will identify various intermediate stages of fabrication of the semiconductor structure 100. It is to be understood that the intermediate stages are exemplative only. More or less intermediate stages may be implemented in processing the semiconductor structure 100, and the disclosed stages may be in a different order or sequence. In addition, one or more processes may be incorporated within various intermediate stages as described herein, and one or more processes may be implemented in intermediate stages as otherwise described herein.

FIG. 1 is a plan view of the semiconductor structure 100 at a first intermediate stage of fabrication and FIGS. 2 and 3 are cross-sectional views of the semiconductor structure at the first intermediate stage. The semiconductor structure 100 includes a semiconductor substrate 102 defining a first or longitudinal x-axis and a second or y-axis orthogonal to the x-axis. The semiconductor substrate 102 may be in the form of a substrate or wafer comprising a silicon (Si) material or other dielectric material, such as silicon oxide or silicon nitride. While the semiconductor substrate 102 is illustrated as a generic substrate layer, it is to be understood that the semiconductor substrate 102 may comprise one of different types of semiconductor substrate structures and materials. For example, in one embodiment, the semiconductor substrate 102 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g., III-V), etc. In another embodiment, the semiconductor substrate 102 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of, for example, a front end of line (FEOL) or and middle of line (MOL) device. In illustrative embodiments, the semiconductor substrate 102 may have a thickness of about 500 to 1000 micrometers (μm). The semiconductor substrate 102 may itself comprise multiple layers, although it is shown as a single layer in the figures, again for clarity and simplicity of illustration.

The semiconductor substrate 102 includes at least two nanosheet stacks 104 (e.g., active areas or regions) extending along the longitudinal x-axis and a plurality of dummy gates 106 extending transversely over the nanosheet stacks 104 relative to the orthogonal y-axis. The number of nanosheet stacks 104 and dummy gates 106 may vary. The nanosheet stacks 104 may be continuous or segmented. Each nanosheet stack 104 includes an alternating series of sacrificial layers 108 and channel layers 110. In illustrative embodiments, the sacrificial layers 108 comprise silicon-germanium (SiGe) and the channel layers 110 comprise silicon (Si). Other materials for the sacrificial layers 108 and the channel layers 110 and are also contemplated. The sacrificial layers 108 are "sacrificial" meaning they are substantially removed in subsequent processing steps. The channel layers 110 will be the nanosheet layers or sheets of a nanosheet channel transistor structure subsequent to release or removal of the sacrificial layers 108. Although the nanosheet stacks 104 are shown as including three sacrificial layers 108 and three channel layers 110, it should be understood that in other illustrative embodiments any number of first sacrificial layers 108 and first channel layers 110 may be used. In addition, any semiconductor material composition may be used for the sacrificial layers 108 and the channel layers 110 so long as at least one of the compositions selected allow for selective etching between at least two of them. More specifically, any type IV semiconductor composition combination and/or III-V semiconductor composition combination may be suitable. In addition, the thickness of the sacrificial layers 108 are shown as being substantially equal. However, it is to be appreciated that the thicknesses of the sacrificial layers 108 may vary. In illustrative embodiments, the height or thickness of the first sacrificial layers 108 may range from about 4 nanometers (nm) to about 30 nanometers (nm), and more particularly, may range from about 6 nanometers (nm) to about 15 nanometers (nm). The channel layers 110 may have similar or identical thicknesses.

The sacrificial layers 108 and the channel layers 110 may be epitaxially grown in an alternating fashion in accordance with conventional methodologies. For example, the alternating series of the silicon germanium (SiGe) sacrificial layers 108 and the silicon (Si) channel layers 110 may be formed by epitaxially growing one layer and then the next until the desired number and desired thicknesses of the sacrificial and channel layers 108, 110 are achieved. Epitaxial materials can be grown from gaseous or liquid precursors, and may be grown using vapor-phase epitaxy (VPE), molecular-beam epitaxy (MBE), liquid-phase epitaxy (LPE), or other suitable processes. Epitaxial silicon (Si), silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor structure. The nanosheet stacks 104 further include an additional sacrificial layer 112 adjacent the substrate 102. The additional sacrificial layer 112 may be epitaxially grown as described hereinabove. In illustrative embodiments the additional sacrificial layer 112 comprises a silicon germanium (SiGe) with a higher percentage of germanium (Ge) than that of first sacrificial layer 108 material, e.g., the first sacrificial layer 108 may comprise SiGe with 30% Ge, while additional sacrificial layer 112 may comprise SiGe with 60% Ge. FIG. 3 also depicts one or more shallow trench isolation (STI) layers 114 disposed between and isolating adjacent nanosheet stacks 104. The STI layers 114 may be formed via conventional patterning and depositions processes. After STI dielectric CMP, the STI dielectric is recessed to the level that is below the lower surface of the additional sacrificial layer 112.

The dummy gates 106 are formed on the nanosheet stacks via conventional methodologies. The dummy gates 106 each serve as a placeholder that is subsequently removed and replaced with suitable gate materials to form a functional gate structure. The dummy gates 106 may comprise any material that can be etched selectively to the materials of the sacrificial layers 108 and the channel layers 110. One suitable material for the dummy gates 106 includes a silicon material, such as polysilicon, or any suitable material such as amorphous silicon, or SiGe. Please note that prior to the sacrificial material deposition, a thin SiO2 layer can be conformally deposited first to separate the nanosheet stack from the sacrificial gate material. After that, hard mask layer 116 may be formed of any suitable material, e.g., a silicon nitride (SiN) over the dummy gates 106. The hard mask layer 116 and the dummy gates 106 may be further patterned by conventional lithographic and etch process to form arrays of gates over the nanosheet stacks. The hard mask layer 116 protects the top surface of the sacrificial gate during formation of the epitaxial source/drain regions. exposed during S/D epi formation.

Figure 4:
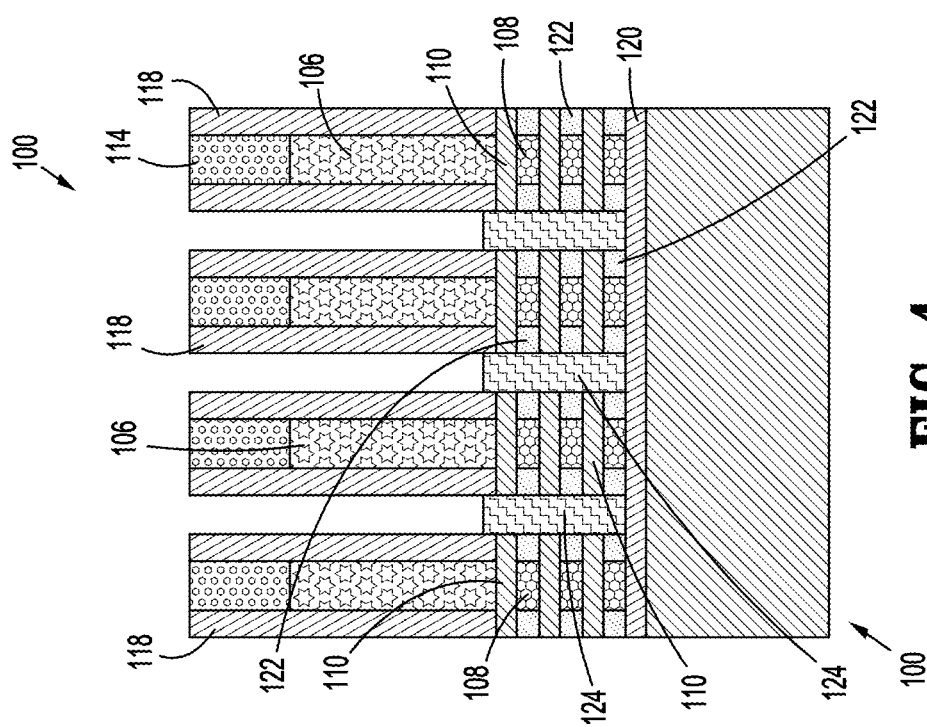

Referring now to FIGS. 4 and 5, a second intermediate stage of fabrication of the semiconductor structure 100 is illustrated. In the second stage, the additional sacrificial layer 112 of the nanosheet stacks 104 is removed via a conventional etching process. Thereafter, a gate spacer 118 is formed around the dummy gates 106 and the hard mask layer 116. The gate spacer 118 may comprise a dielectric material, such as silicon boron carbide nitride (SiBCN), an oxide, nitride, silicon nitride (SiN), silicon oxide SO2 or other materials including low-k materials. In illustrative embodiments, the gate spacer 118 comprises silicon boron carbide nitride (SiBCN). The gate spacer 118 may be formed using a deposition process, such as chemical vapor deposition (CVD) or ALD and a reactive-ion etching (RIE) process. The gate spacer 118 may be present on the sidewalls of the dummy gate 106, and may have a wall thickness ranging from about 3 nanometers (nm) to about 15 nanometers (nm). In conjunction with formation of the gate spacer 118, a bottom isolation spacer 120 is also formed in the areas vacated by the removed additional sacrificial layers 112. The bottom isolation spacer 120 may be formed during deposition of the gate spacer 118 or alternatively formed during another deposition process.

The nanosheet stacks 104 are then recessed to remove portions of the nanosheet stack 104 that extend beyond the gate spacer 118. In illustrative embodiments, one or more etching processes are used including, for example, an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In addition, or in conjunction therewith, the lateral exposed surfaces of the sacrificial layers 108 are subjected to an etch process, for example, a lateral hydrogen chloride (HCl) gas isotropic etch process, or an aqueous etch comprising hydrogen peroxide and ammonia, selective to the channel layers 110, to create a plurality of lateral etches or undercut etches within sacrificial layers 108. A conformal dielectric layer (not shown) over the semiconductor structure 100 including at least the nanosheet stack 104. The conformal dielectric layer fills the recesses in the sacrificial layers 108 to form inner spacers 122 in the recesses of the sacrificial layers 108 between the channel layers 110. An isotropic inner spacer liner etch is then applied to remove any exposed inner spacer liner that is not pinched-off in the said undercut regions.

With continued reference to FIGS. 4 and 5, source and drain (S/D) regions 124 are formed using an epitaxial layer growth process on the sidewalls of the nanosheet stacks 104. In illustrative embodiments, the S/D regions 124 comprise epitaxial growth of boron doped silicon germanium (SiGe) similar to the material of the sacrificial layers 108 for as PFET device. Alternatively, the S/D regions 124 may include epitaxial growth of phosphorus doped silicon for NFET devices. The epitaxial growth or layers may provide at least a portion of the S/D regions 124 of the semiconductor structure 100. As used herein, the term "drain" means a doped region in a semiconductor structure located at the end of the channel region, in which carriers are flowing out of the semiconductor structure 100, e.g., nanosheet transistor structure, through the drain. The term "source" is a doped region in the semiconductor structure, in which a majority of carriers are flowing into the channel region. The S/D regions 124 can be formed by in-situ doping (doping during epitaxy) or ex-situ, or a combination of in-situ doping and ex-situ doping. Doping techniques may include but, are not limited to, ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA) or any suitable combination of those techniques.

Epitaxial growth or deposition of the S/D regions 124 may be carried out in a chemical vapor deposition apparatus, such as a metal organic chemical vapor deposition (MOCVD) apparatus or a plasma enhanced chemical vapor deposition (PECVD) apparatus. The S/D regions 124 may be in situ doped to a p-type or n-type conductivity. The term "in situ" denotes that a dopant, e.g., p-type or n-type dopant, is introduced to the base semiconductor material, e.g., silicon or silicon germanium, during the formation of the base material. In one illustrative embodiment, for a p-type conductivity, boron p-type dopants are introduced into the epitaxial growth of silicon germanium and, for an n-type conductivity, phosphorous n-type dopants are introduced into the epitaxial growth of silicon.

Figure 7:
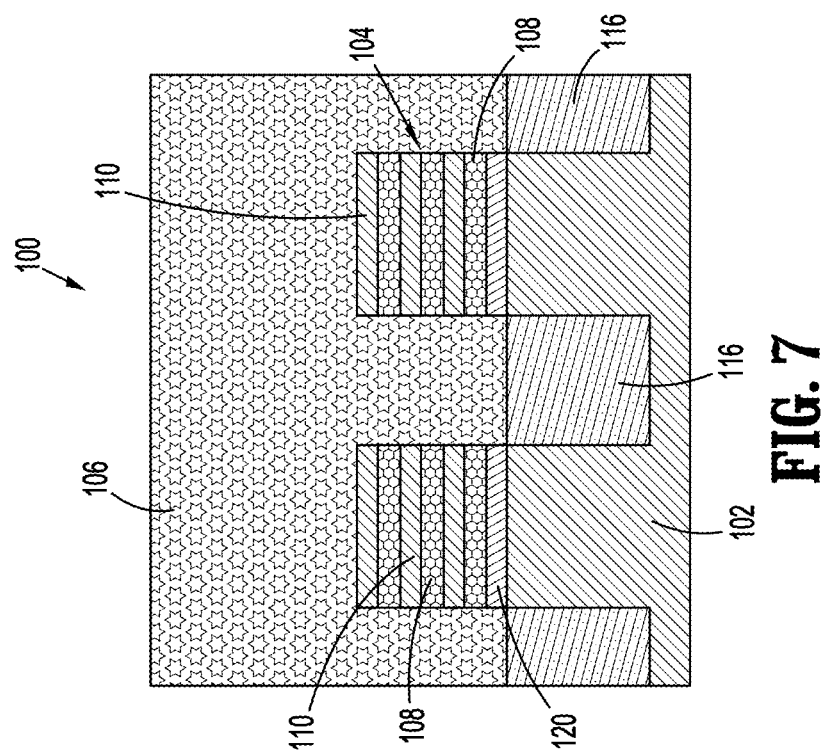
FIGS. 6 and 7 are cross-sectional views of the semiconductor structure similar to the views of FIGS. 4 and 5, respectively, at a third intermediate stage of fabrication, illustrating deposition of an interlayer dielectric according to one or more illustrative embodiments.
Figure 6:
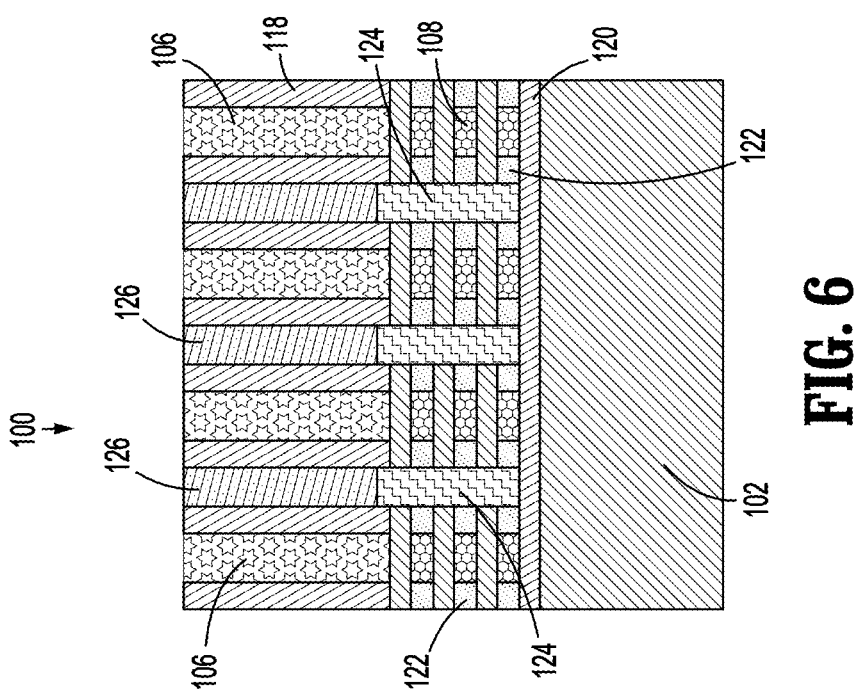

Referring now to FIGS. 6 and 7, a third intermediate stage of fabrication of the semiconductor structure is illustrated. An oxide material is deposited onto the semiconductor structure 100 to at least partially encompass the S/D regions 124 and the dummy gates 106 forming an inter-layer dielectric (ILD) 126. In illustrative embodiments, the height of the oxide material or inter-layer dielectric (ILD) 126 can be reduced by chemical-mechanical polishing (CMP) and/or etching to permit removal of the hard mask layer 116 via one or more etching processes thereby exposing the underlying dummy gate 106. Other suitable dielectric materials for forming the inter-layer dielectric (ILD) 126 include but are not limited to, silicon oxide, silicon nitride, silicon oxynitride, SiCO, SiCON, or any suitable combination of such materials. The interlayer dielectric 126 overlies the S/D regions 124 and is disposed between adjacent dummy gates 106.

Figure 12:
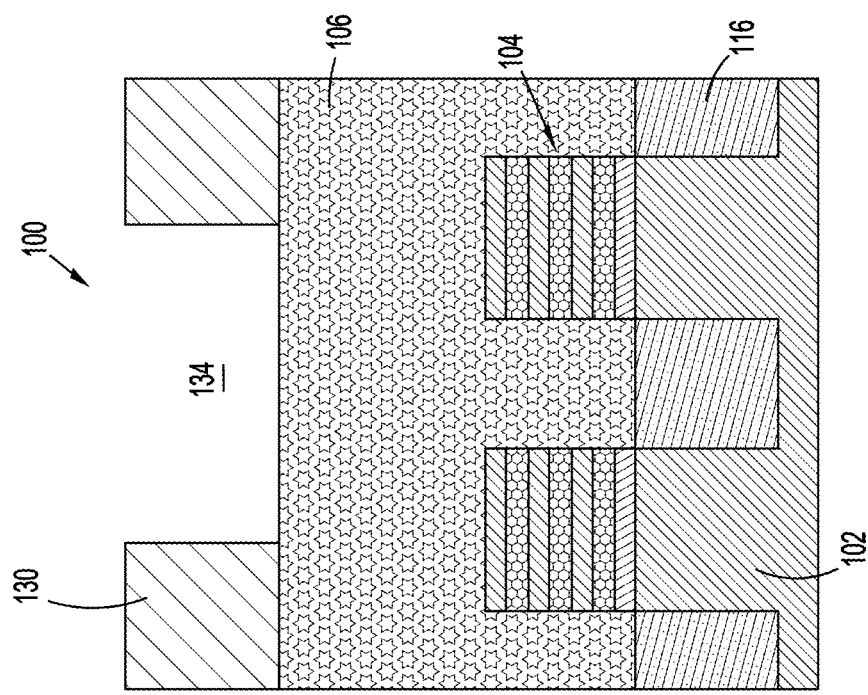
FIGS. 11 and 12 are cross-sectional views of the semiconductor structure taken along the lines Y1-Y1 and Y2-Y2 of FIG. 8 respectively at the fourth intermediate stage of fabrication illustrating the second opening in the mask according to one or more illustrative embodiments.
Figure 11:
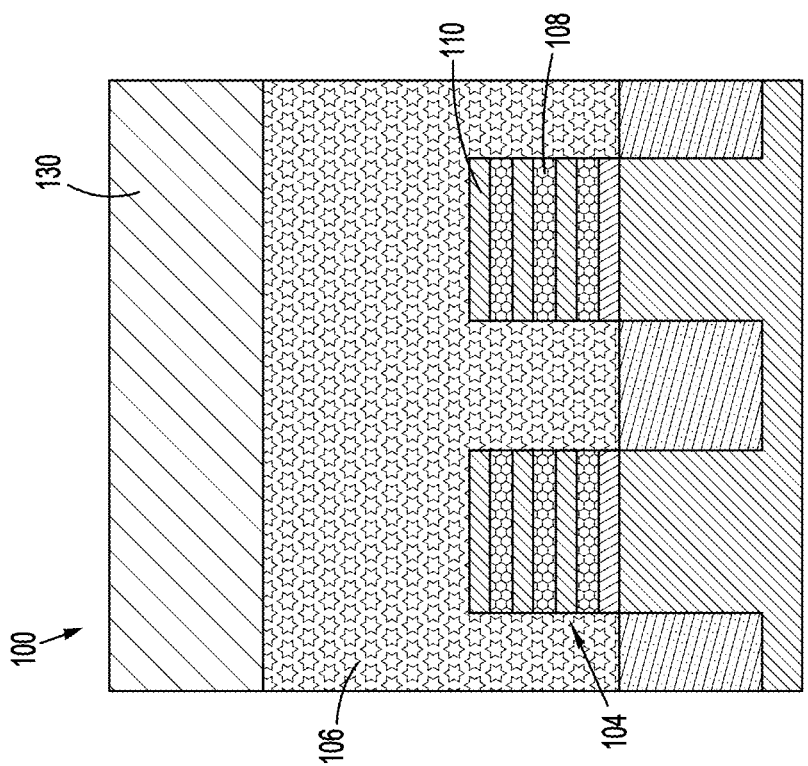

FIG. 8 is a plan view of the semiconductor structure 100 similar to the view of FIG. 1 illustrating a fourth intermediate stage of fabrication of the semiconductor structure 100. FIGS. 9 and 10 are cross-sectional views taken along the lines X1-X1 and X2-X2, respectively of FIG. 8 and FIGS. 11 and 12 are cross-sectional views taken along the lines Y1-Y1 and Y2-Y2, respectively of FIG. 8. In accordance with the fourth intermediate stage, a lithographic mask, schematically shown as reference numeral 128 is deposited on the top of the semiconductor structure. The lithographic mask 128 may include an organic planarizing layer (OPL) 130, and a hard mask layer (not shown) disposed on the OPL 130, and a photoresist layer (not shown) deposited over the ARC layer which is then photo-exposed using a lithographic mask. The OPL 130 is formed using known organic materials and techniques. For example, the OPL 130 may comprise a resin material that is applied by spin coating and baked to enhance planarization. In some embodiments, the OPL 130 is formed to a thickness of approximately 60 nm, although these and other dimensions are presented herein as illustrative examples and should not be construed as limiting. In one embodiment, the hard mask layer (not shown) comprises an anti-reflection coating (ARC) layer (e.g., a SiARC layer). In illustrative embodiments, the lithographic mask 128 is an extreme ultraviolet (EUV) lithographic mask, incorporating an EUV resist on over the OPL 130 and on the hard mask layer. The EUV resist mask comprises a photosensitive material suitable for patterning using an EUV radiation source. The layer of EUV resist material can be exposed and developed using techniques known to those of ordinary skill in the art, the details of which are not necessary for understanding the methods discussed herein. After lithographic exposure, unwanted photoresist is removed after development, followed by a SiARC and OPL RIE processes. The patterning process produces first and second openings 132, 134 schematically shown in FIG. 8 in the lithographic mask 128. The first opening 132 overlies a select dummy gate 106s and enables the ultimate formation of a single diffusion break (SDB) in the semiconductor structure 100. The second opening 134 spans select portions of the active region under multiple dummy gates 106 to be removed to define tapered active region for devices with smaller effective channel width.

FIGS. 9-12 illustrate the semiconductor structure at the fourth intermediate stage illustrating the transfer of the image of the lithographic mask 128 through the OPL 130 to pattern the OPL 130 in accordance with the patterned mask. As shown, the first opening 132 overlies the select dummy gate 106s. (FIG. 8). The second opening 134 extends across multiple, for example, three, dummy gates 106 and encompasses at least portions of the nanosheet stacks 104.

Figure 17:
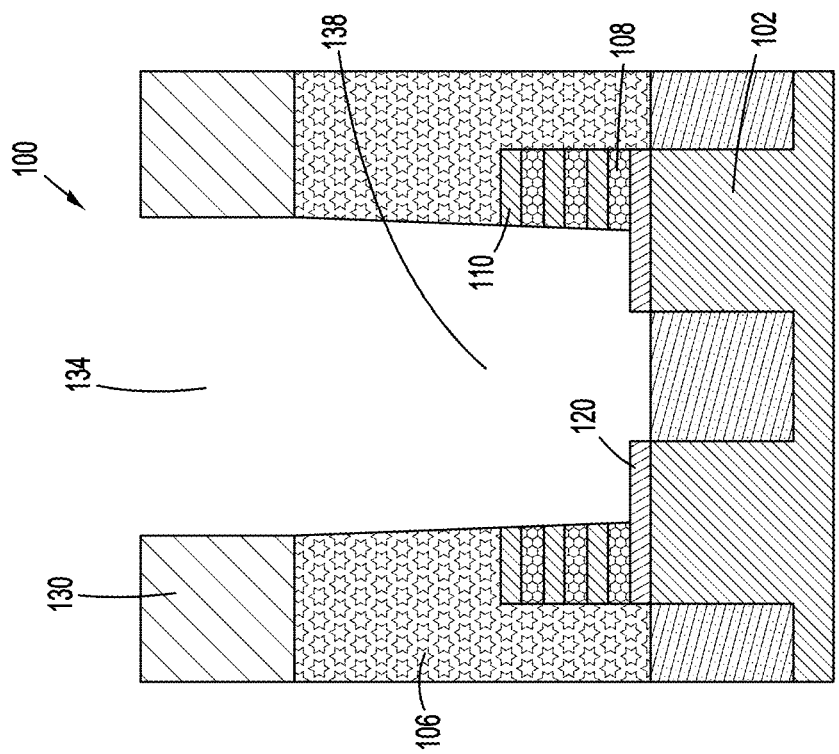
FIGS. 16 and 17 are cross-sectional views of the semiconductor structure taken along the lines Y1-Y1 and Y2-Y2 of FIG. 13, respectively, at the fifth intermediate stage of fabrication illustrating the tapered recess according to one or more illustrative embodiments.
Figure 16:
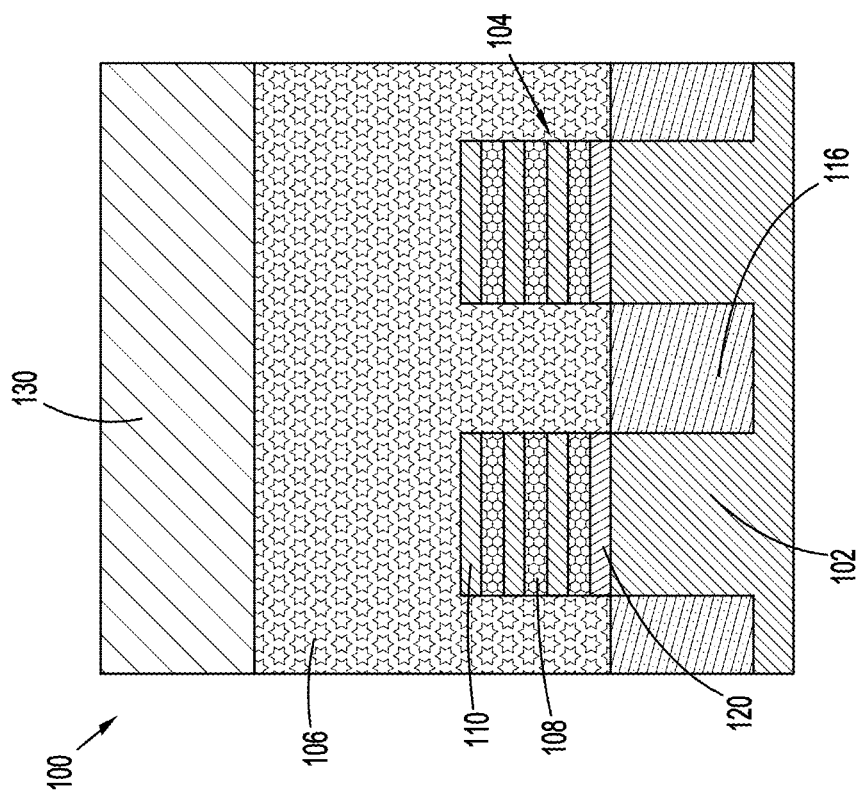
Figure 21:
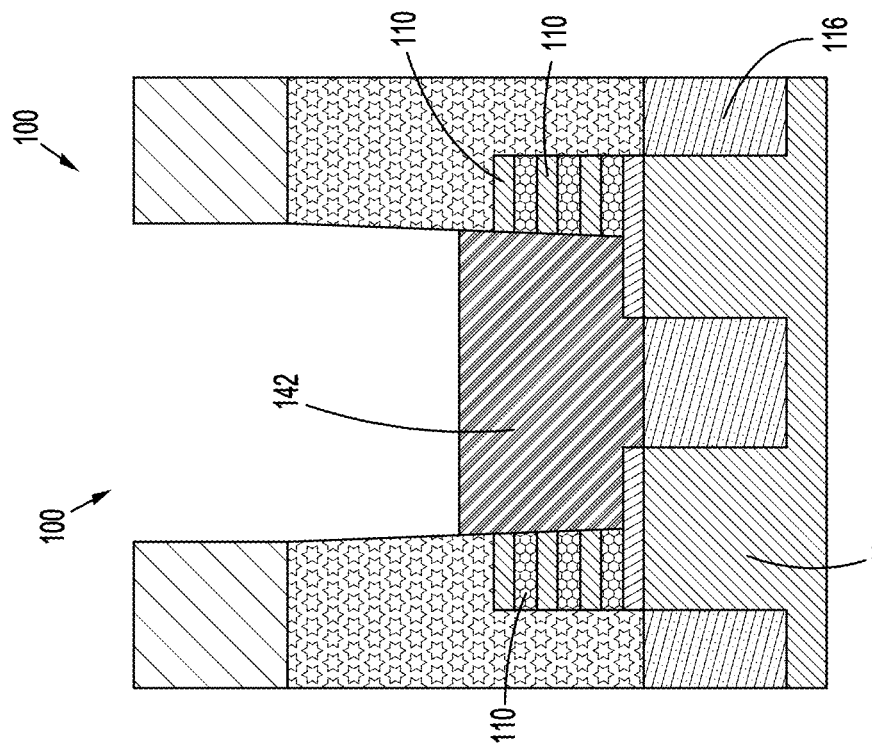
FIGS. 20 and 21 are cross-sectional views of the semiconductor structure similar to the views of FIGS. 16 and 17, respectively at the sixth intermediate stage of fabrication illustrating formation of the tapered isolator according to one or more illustrative embodiments.
Figure 20:
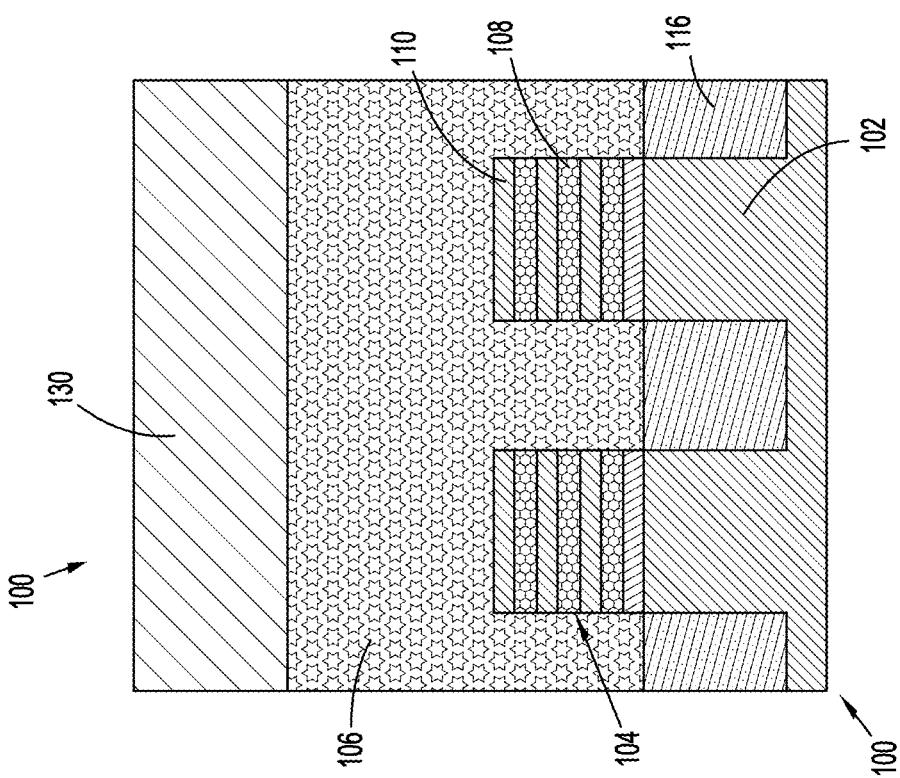
Figure 23:
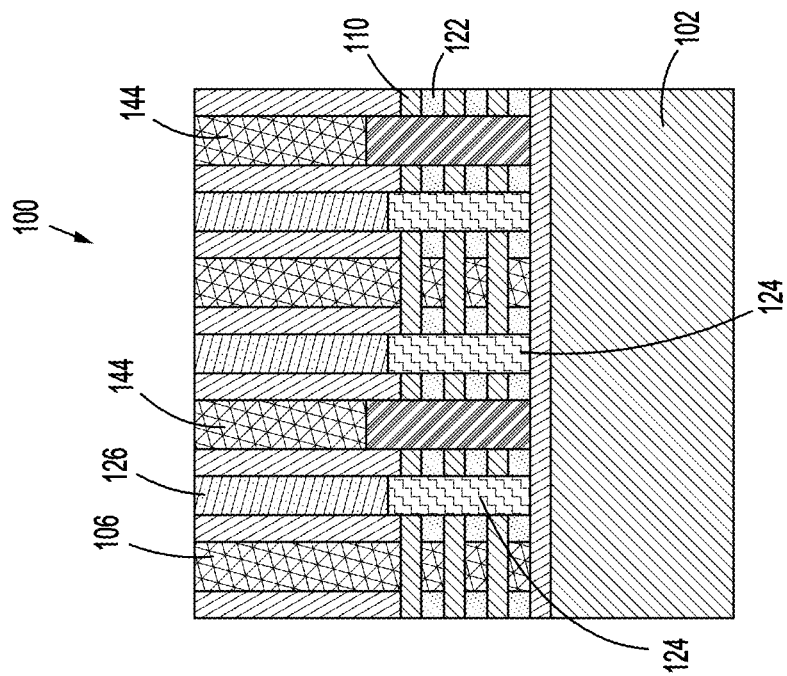
FIGS. 22 and 23 are cross-sectional views of the semiconductor structure similar to the views of FIGS. 18 and 19, respectively at a seventh intermediate stage of fabrication illustrating removal of the sacrificial layers and formation of one or more gate structures according to one or more illustrative embodiments.
Figure 22:
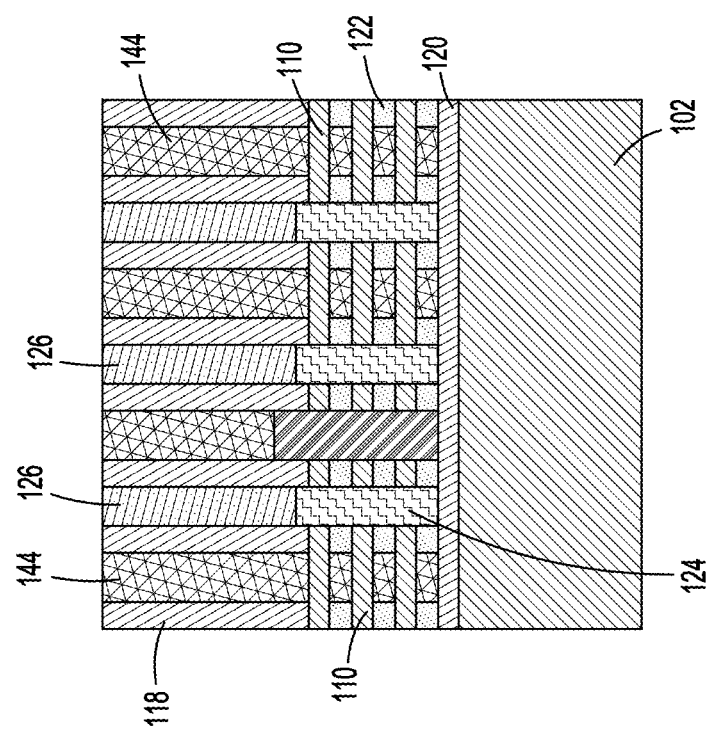
Figure 25:
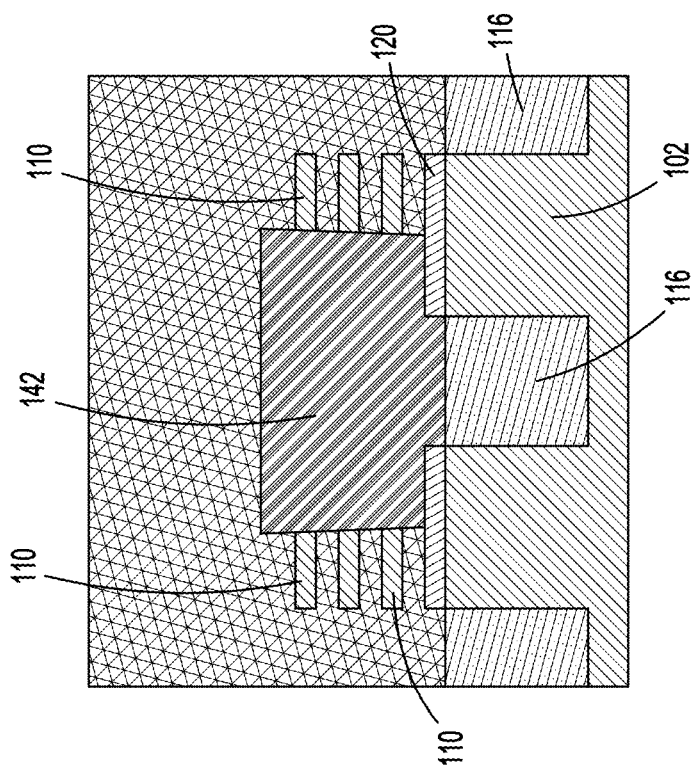
FIGS. 24 and 25 are cross-sectional views of the semiconductor structure similar to the views of FIGS. 20 and 21, respectively at the seventh intermediate stage of fabrication illustrating formation of one or more gate structures according to one or more illustrative embodiments.
Figure 24:
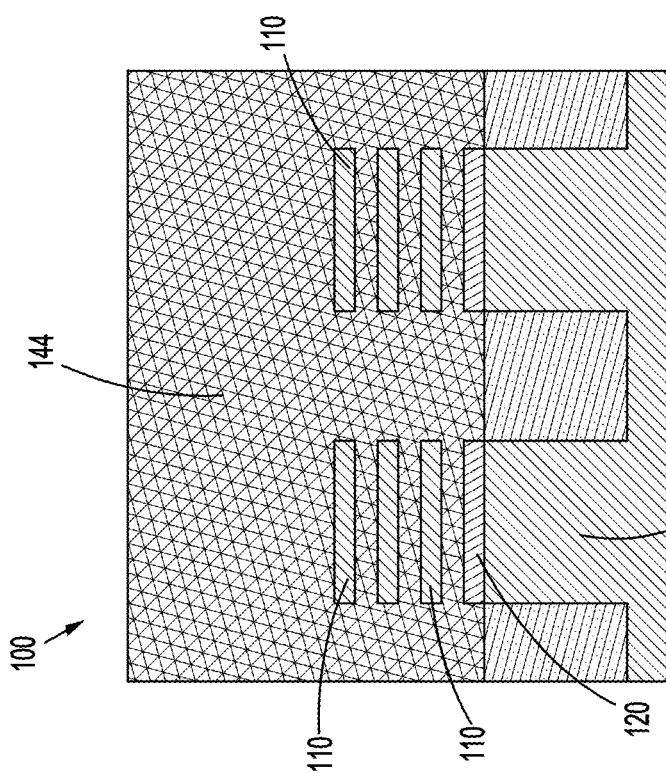

Referring now to FIGS. 13-17, a fifth intermediate stage of fabrication of the semiconductor structure 100 is illustrated. FIG. 13 is a plan view of the semiconductor structure 100 similar to the view of FIG. 8. FIGS. 14 and 15 are cross-sectional views taken along the lines X1-X1 and X2-X2, respectively of FIG. 13 and FIGS. 16 and 17 are cross-sectional views taken along the lines Y1-Y1 and Y2-Y2, respectively of FIG. 13. In accordance with the fifth stage of fabrication, the pattern formed in the lithographic mask 128 and transferred to the OPL 130 is used as a template to remove underlying components of the semiconductor structure 100. For example, using one or more etching processes selective to the materials of the gate spacer 118 and the ILD 126, the select dummy gate 106s aligned with the first opening 132 in the lithographic mask 128 and the select portions 106p (FIG. 8) of multiple dummy gates 106 aligned with the second opening 134 disposed along the x-axis are removed. The removed select dummy gate 106s and the removed portions 106p of the three dummy gates 106 are shown for illustrative purposes. As best depicted in FIGS. 14 and 15, the etching process through the first opening 132 in the lithographic mask 128 removes the select dummy gate 106 forming a first trench opening 136. The etching process including, for example, a reactive ion etch (RIE) process, is also performed through the second opening 134 as depicted in FIGS. 16 and 17 to removes portions of three adjacent dummy gates 106 thereby forming a second trench opening 138. The etching process also etches away any exposed nanosheet stack as depicted in FIG. 17. This creates the tapered active region as the shape of the active region (please see FIG. 13) is no longer a rectangular shape but a non-uniform shape. The etching of the nanosheet stack could stop over bottom isolation spacer 120 and STI layer 114.

Referring now to FIGS. 18-21, in a sixth stage of fabrication of the semiconductor structure 100, a dielectric fill is deposited in the first and second trench openings 136, 138 (FIGS. 14 and 17) through known deposition technique including, for example, a plasma enhanced atonic layer deposition (PEALD) process. One suitable dielectric fill includes silicon nitride (SiN). The dielectric fill is etched down to a location above the nanosheet stacks 104 via any suitable etching process including a RIE etching process. The deposition and etching of the dielectric fill form a first dielectric isolator 140 within the first trench opening 136 integral or in contact with the bottom isolation spacer 120. The first dielectric isolator 140 forms a single diffusion break in the removed gate of the gate structure. The deposition and etching of the dielectric fill also form a second dielectric isolator 142 which spans multiple replacement gates and creates a break in each replacement gate encompassed by the second trench opening (along the y-axis; see also FIG. 13).

Referring now to FIGS. 22-25, the OPL 130 is removed via one or more removal processes including, for example, an ash etching process. The etching material can be an oxygen ash or a nitrogen or hydrogen-based chemistry including, e.g., nitrogen gas or hydrogen gas, or a combination thereof. The ash etching process removes the OPL 130 with little or no gouging of the underlying components of the semiconductor structure 100. Thereafter, the dummy gates 106 are removed. In illustrative embodiments, removal of the dummy gates 106 may be effected using a wet or dry etch process. More specifically, the dummy gates 106 may be removed by at least one of an isotropic etch process, such as reactive ion etch (RIE), or a wet chemical etch, or a combination of both. Upon removal of the dummy gates 106, openings exposing the underlying the first and second nanosheet stacks 104 are formed.

Following removal of the dummy gates 106, the sacrificial layers 108 comprising silicon germanium are removed selectively from the channel layers 110 of the nanosheet stacks 104. In illustrative embodiments, the sacrificial layers 108 may be removed via a conventional selective etching process. Upon removal of the sacrificial layers 108, the channel layers 110 of the nanosheet stacks 104 are released. The released silicon channel layers 110 form the active channel nanosheets of the nanosheet transistor structures of the semiconductor structure 100.

With continued reference to FIGS. 22-25, high-k/metal gate structures 144 are formed around each of the channel layers of the nanosheet stacks 104 within the voids left by removal of the dummy gates 106 and between the suspended channel layers 110. In one exemplative embodiment, a high-k dielectric material can be deposited to form the gate dielectric. The gate dielectric may comprise a semiconductor oxide, semiconductor nitride, semiconductor oxynitride, or a high-k material having a dielectric constant greater than silicon oxide. A metal liner, e.g., a work-function metal, and a gate metal can then be deposited on the dielectric material filling the void to complete the high-k/metal gate structure 144.

In one or more embodiments, the metal liner can be, for example, TiN, TiC, TiAl, TiAlC, or TaN, and the gate metal or conductor may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate metal can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. The material forming the metal gate may be subjected to one or more removal or planarization processes to be coplanar with the gate spacer 118.

Referring now to FIGS. 26-29, the ILD 126 or portions extending between gate spacer 118 of high-k/metal gate structures 144 and in alignment with the S/D regions 124 are removed by one or more etching processes selective to the material of the gate spacer 118. Thereafter, source and drain contacts 146 are formed by deposition of a suitable conductive material within the vacated ILD layers. The source and drain contacts 146 may include any currently known or later developed conductive material configured for use in an electrical contact, e.g., a silicide layer at bottom such as Ni, Ti, NiPt, followed by an adhesion metal liner, such as TiN, followed by low resistance metal fills, such as copper (Cu), aluminum (Al), tungsten (W), cobalt (Co), Ru etc.

Figure 26:
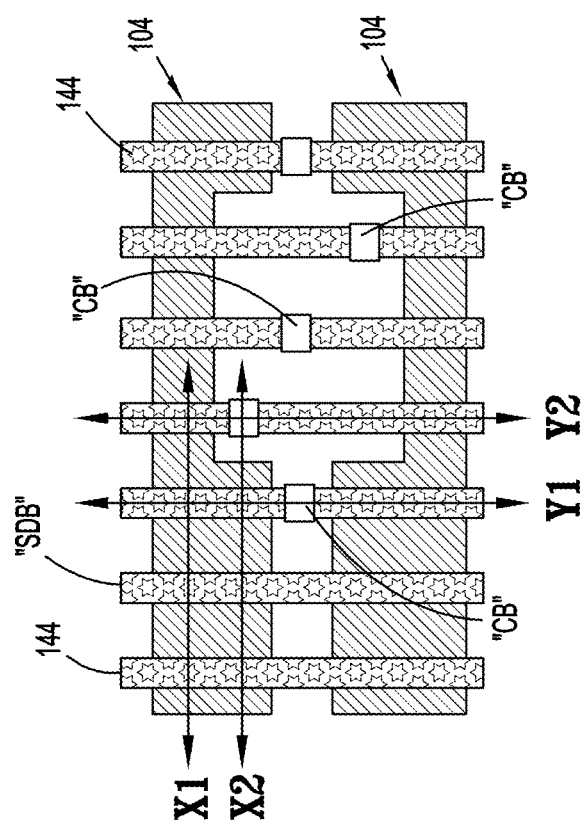
FIG. 26 is a plan view of the semiconductor structure similar to the view of FIG. 13 at an eighth intermediate stage of fabrication illustrating formation of the gate contacts.
Figure 28:
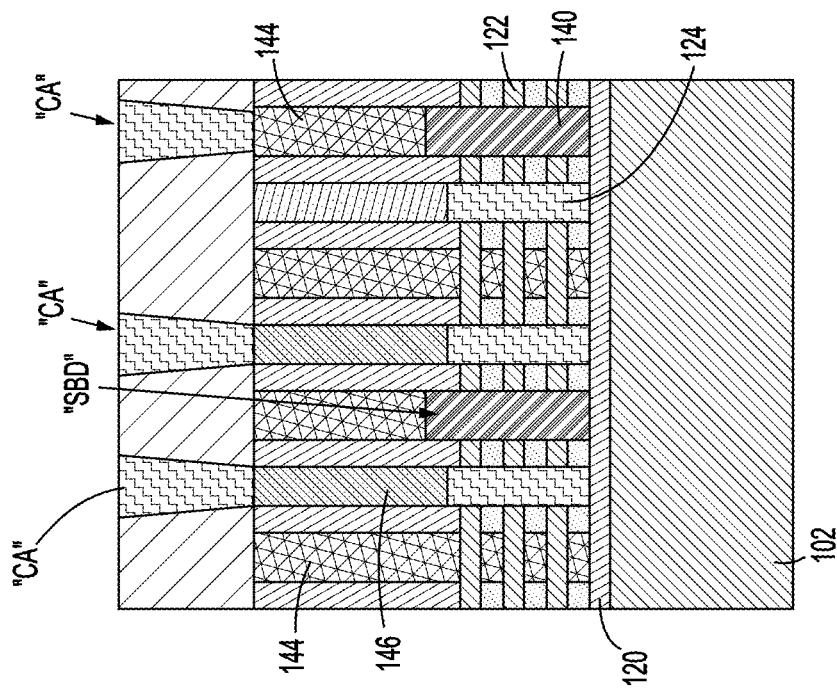
FIGS. 27 and 28 are cross-sectional views of the semiconductor structure similar to the views of FIGS. 22 and 23, respectively at an eight intermediate stage of fabrication illustrating deposition of an interlayer dielectric and formation of the source/drain contacts and the gate contacts according to one or more illustrative embodiments.
Figure 27:
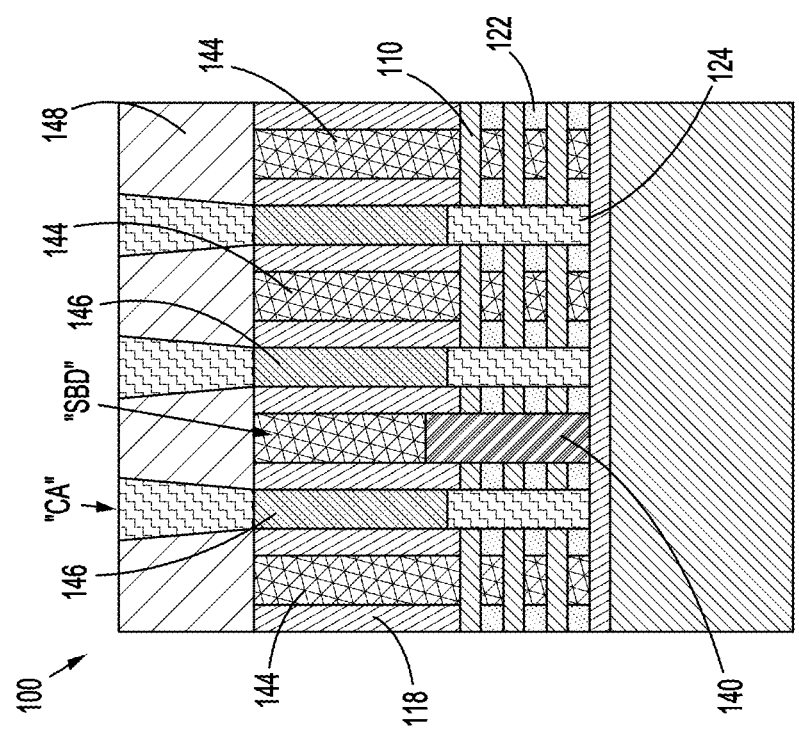
Figure 30:
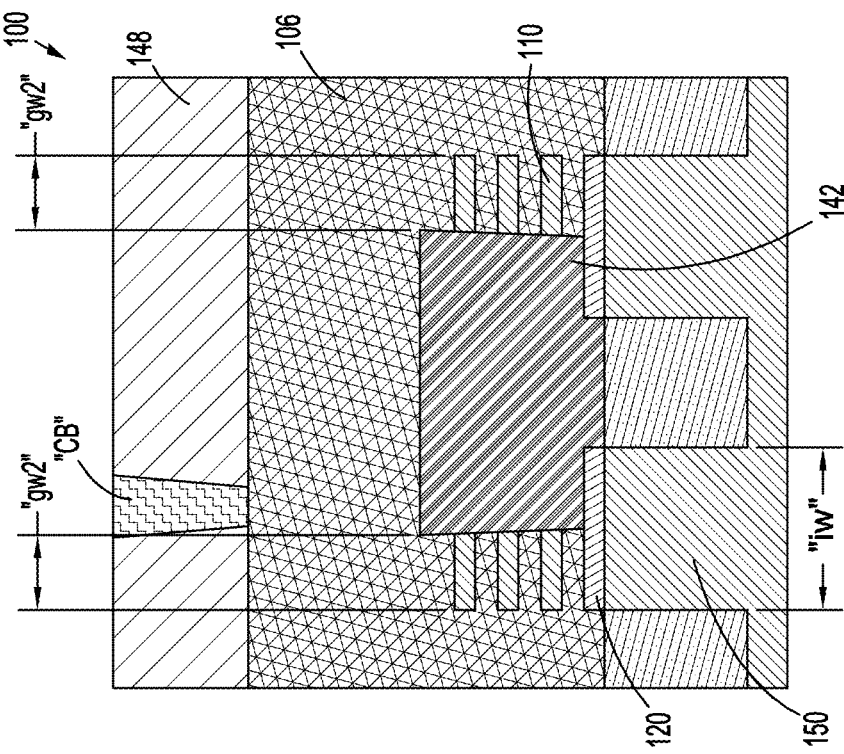
FIGS. 29 and 30 are cross-sectional views of the semiconductor structure similar to the views of FIGS. 24 and 25, respectively at the eighth intermediate stage of fabrication illustrating the gate contacts according to one or more illustrative embodiments.
Figure 29:
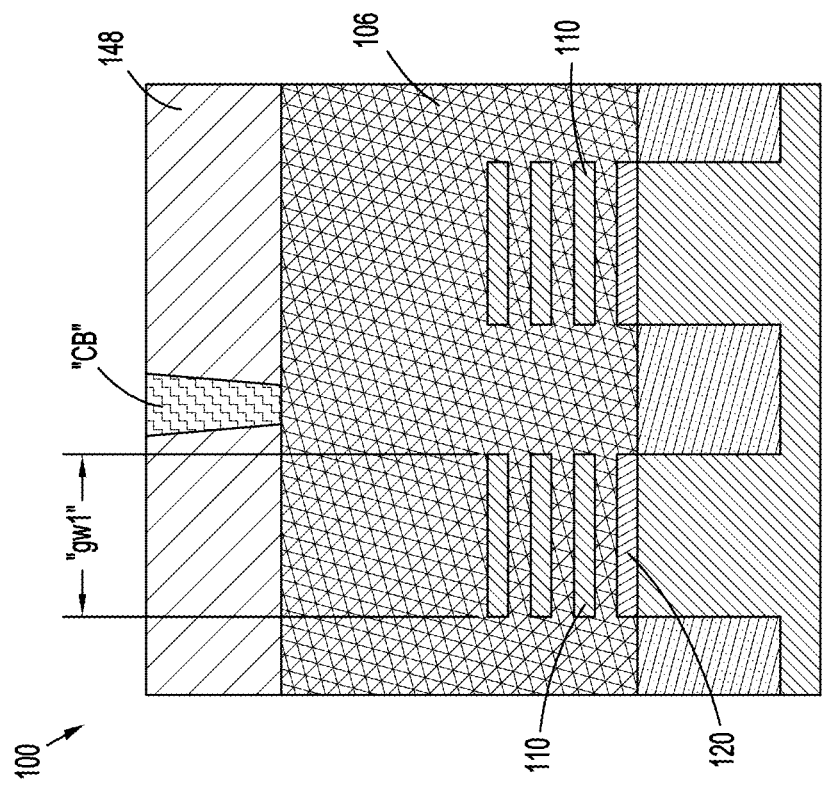

Following the formation of the semiconductor structure 100 shown in FIGS. 26-29, any known sequence of processing steps can be implemented to complete the fabrication of the semiconductor structure, the details of which are not needed to understand embodiments of the disclosure. Briefly, by way of example, an interlayer dielectric 148 is deposited on the semiconductor structure 100. Thereafter, using, e.g., known lithographic, etching and metallization processes, S/D contact vias "CA" are formed to electrically couple with the source and drain contacts and gate contact vias "CB" are formed to electrically couple with the gate electrodes. Thus, the semiconductor structure depicted in FIGS. 26-30 includes multiple nanosheet stacks 104 (e.g., two or more) and high-k/metal gate structures 144 overlying the nanosheet stacks 104. Moreover, the semiconductor structure 100 comprises one or more gate all around (GAA) gates (FIG. 26), one or more single diffusion breaks (SBD) provided by the area occupied by the first dielectric isolator 140 between longitudinally high-k/metal gate structures 144 and at least one dielectric isolator spanning multiple gates (FIGS. 26 and 30).

More specifically, the semiconductor structure includes one or more first nanosheet stacks 104 disposed on the substrate each with a gate structure formed around and within the first nanosheet stack 104. The first nanosheet stack (FIG. 29) and associated gate structures (which are devoid of the dielectric isolator) may be gate all around (GAA) nanosheets transistor regions. More specifically, the channel layers 110 define a length or width "gw1" (active channel) along the y-axis. (FIG. 29) The second nanosheet region, which includes the second dielectric isolator 142, is longitudinally spaced along the longitudinal x-axis from the first nanosheet region. The second nanosheet region (FIG. 30) defines a second channel width "gw2" (active channel) along the y-axis. Due to the presence of the second dielectric isolator 142, the second channel width "gw2" of the second nanosheet region is less than the first channel width "gw1" of the first nanosheet region. This arrangement substantially reduces power consumption across the second channel, i.e., second nanosheet region.

Furthermore, in illustrate embodiments, due to the tapered featured of the second dielectric isolator 142, the upper channel layers 110 may define a width which is less than the lower channel layers 110. In addition, the individual channel layers 110 are in contact with the second dielectric isolator 142 as shown. This forms a tri-gate nanosheet transistor (or called forksheet device). The second nanosheet device is a tri-gate (or forksheet device) nanosheet device, where the gates control three surfaces of the second nanosheet region with the exception of the portion that contacts the second dielectric isolator 142. In addition, the width of the remaining bottom isolation spacer 120 along the y-axis is greater than the second channel width "gw2," and may be substantially equal to the width "iw" of the nanosheet island 150 (upon which the second nanosheet region is disposed) of the substrate 102.

In some embodiments, the above-described techniques are used in connection with manufacture of nanosheet transistor structures for semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a substrate defining a first axis and a second axis orthogonal to the first axis;
   a first nanosheet region disposed on the substrate, the first nanosheet region defining a first channel width along the second axis, wherein the first nanosheet region includes a plurality of first channel nanosheets and a first dielectric isolator, and wherein the first dielectric isolator is in contact with a bottom isolation spacer, the bottom isolation spacer defining a bottom spacer width along the second axis;
   a first gate disposed around the first nanosheet region;
   a second nanosheet region disposed on the substrate, the second nanosheet region defining a second channel width along the second axis, the second channel width of the second nanosheet region being less than the first channel width of the first nanosheet region, wherein the second nanosheet region includes a plurality of second channel nanosheets and a second dielectric isolator, and wherein each of the plurality of the second channel nanosheets is in contact with the second dielectric isolator, the second dielectric isolator defining a nanosheet island beneath the second nanosheet region, the nanosheet island defining an island width along the second axis substantially equal to the bottom spacer width, the bottom spacer width being greater than the second channel width of the second nanosheet region; and
   a second gate disposed around the second nanosheet region.

2. The semiconductor structure according to claim 1 wherein the first nanosheet region includes at least two spaced sets of the first channel nanosheets and the second nanosheet region includes at least two spaced sets of the second channel nanosheets.

3. The semiconductor structure according to claim 2 wherein the second dielectric isolator is disposed between the at least two spaced sets of the second channel nanosheets.

4. The semiconductor structure according to claim 3 wherein the first nanosheet region and the first gate form a semiconductor gate all around device.

5. The semiconductor structure according to claim 2 wherein the first nanosheet region and the first gate form a semiconductor forksheet device.

6. The semiconductor structure according to claim 2 wherein the first nanosheet region and the first gate form a first nanosheet device and the second nanosheet region and the second gate form a second nanosheet device, the first and second nanosheet devices adjacent each other with respect to the first axis.

7. The semiconductor structure according to claim 2 including the bottom isolation spacer disposed adjacent the substrate.

8. The semiconductor structure according to claim 1 including at least two additional gates and a diffusion break disposed between the at least two additional gates.

9. The semiconductor structure according to claim 1 including one or more contacts in communication with the first and second gates.

10. A semiconductor structure, comprising:
    a substrate defining a first axis and a second axis orthogonal to the first axis;
    at least two nanosheet stacks disposed on the substrate and extending along the first axis, the at least two nanosheet stacks comprising a plurality of channel nanosheets;
    a first dielectric isolator in contact with a bottom isolation spacer, the bottom isolation spacer defining a bottom spacer width along the second axis being greater than a width of at least one of the at least two nanosheet stacks;
    a second dielectric isolator coupled to the semiconductor structure between the channel nanosheets of the at least two nanosheet stacks, extending vertically above the at least two nanosheet stacks, and wherein each channel nanosheet of the plurality of channel nanosheets of the at least two nanosheet stacks is in contact with the second dielectric isolator, the second dielectric isolator defining a nanosheet island beneath a second nanosheet stack of the at least two nanosheet stacks, the nanosheet island defining an island width along the second axis substantially equal to the bottom spacer width; and
    a first gate structure extending across the plurality of channel nanosheets of the at least two nanosheet stacks and having gate portions above the first dielectric isolator.

11. The semiconductor structure according to claim 10 including a second gate structure spaced along the first axis from the first gate structure and extending across the plurality of channel nanosheets.

12. The semiconductor structure according to claim 11 wherein the channel nanosheets associated with the first gate structure define a first nanosheet region having a first channel width along the second axis and the channel nanosheets associated with the second gate structure define a second nanosheet region having a second channel width along the second axis, the first channel width being less than the second channel width of the first nanosheet region.

13. The semiconductor structure according to claim 12 wherein the first nanosheet region and the first gate structure form a semiconductor forksheet device.

14. The semiconductor structure according to claim 11 further including one or more contacts in communication with the first gate structure and the second gate structure.

15. The semiconductor structure according to claim 10 further including at least two additional gate structures and a diffusion break disposed between the at least two additional gate structures.

16. A method for forming a semiconductor structure comprising:
- forming a first nanosheet region on a substrate defining a first axis and a second axis orthogonal to the first axis, the first nanosheet region defining a first channel width along the second axis, wherein the first nanosheet region includes a plurality of first channel nanosheets and a first dielectric isolator, and wherein the first dielectric isolator is in contact with a bottom isolation spacer, the bottom isolation spacer defining a bottom spacer width along the second axis;
- forming a first gate disposed around the first nanosheet region;
- forming a second nanosheet region disposed on the substrate, the second nanosheet region defining a second channel width along the second axis, the second channel width of the second nanosheet region being less than the first channel width of the first nanosheet region, wherein the second nanosheet region comprises a second dielectric isolator and at least two nanosheet stacks, wherein each of the at least two nanosheet stacks include a plurality of second channel nanosheets, and wherein each of the plurality of the second channel nanosheets is in contact with the second dielectric isolator, the second dielectric isolator defining a nanosheet island beneath the second nanosheet region, the nanosheet island defining an island width along the second axis substantially equal to the bottom spacer width, the bottom spacer width being greater than the second channel width of the second nanosheet region; and
- forming a second gate disposed around the second nanosheet region.

17. The method according to claim 16 wherein the second dielectric isolator is tapered and extends from the semiconductor structure between the second channel nanosheets of the at least two nanosheet stacks within the second nanosheet region, each of the channel nanosheets of the at least two nanosheet stacks is in contact with the tapered second dielectric isolator.

18. The method according to claim 17 wherein the second dielectric isolator extends vertically above the channel nanosheets of the second nanosheet region.

19. The method according to claim 16 including forming at least two additional gates along the semiconductor structure, and further forming a diffusion break between the at least two additional gates.

20. The method according to claim 16 further including one or more contacts in communication with the first gate and the second gate.

* * * * *